US009209604B2

(12) United States Patent
Park

(10) Patent No.: US 9,209,604 B2
(45) Date of Patent: Dec. 8, 2015

(54) HYBRID LASER INCLUDING ANTI-RESONANT WAVEGUIDES

(75) Inventor: Hyundai Park, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,983

(22) PCT Filed: Mar. 26, 2012

(86) PCT No.: PCT/US2012/030601
§ 371 (c)(1),
(2), (4) Date: Jun. 25, 2013

(87) PCT Pub. No.: WO2013/147740
PCT Pub. Date: Oct. 3, 2013

(65) Prior Publication Data
US 2013/0322890 A1 Dec. 5, 2013

(51) Int. Cl.
H01S 5/00 (2006.01)
H01S 5/30 (2006.01)
H01S 5/343 (2006.01)
H01S 5/10 (2006.01)
H01S 5/20 (2006.01)
(Continued)

(52) U.S. Cl.
CPC .............. H01S 5/3013 (2013.01); B82Y 20/00 (2013.01); H01S 5/1032 (2013.01); H01S 5/2027 (2013.01); H01S 5/343 (2013.01); G02B 6/122 (2013.01); H01S 5/026 (2013.01); H01S 5/0422 (2013.01); H01S 5/34306 (2013.01)

(58) Field of Classification Search
CPC ..... H01S 5/3013; H01S 5/343; H01S 5/1032; H01S 5/2027; H01S 5/026; H01S 5/34306; H01S 5/0422; B82Y 20/00; G02B 6/122
USPC ................................ 372/45.012, 45.014, 50.1
See application file for complete search history.

(56) References Cited

U.S. PATENT DOCUMENTS

2006/0054899 A1* 3/2006 Takahashi et al. .............. 257/80
2009/0116523 A1* 5/2009 Leem et al. ................. 372/44.01
2009/0274411 A1* 11/2009 Bar et al. ......................... 385/14
(Continued)

FOREIGN PATENT DOCUMENTS

WO 2011-104317 A1 9/2011

OTHER PUBLICATIONS

T. Aalto et al., "Integration of InP-based optoelectronics with silicon waveguides," Proceedings of SPIE, vol. 7218, 14 pages, Feb. 9, 2009.
(Continued)

Primary Examiner — Yuanda Zhang
(74) Attorney, Agent, or Firm — Schwabe, Williamson & Wyatt, P.C.

(57) ABSTRACT

Described are embodiments of apparatuses and systems including a hybrid laser including anti-resonant waveguides, and methods for making such apparatuses and systems. A hybrid laser apparatus may include a first semiconductor region including an active region of one or more layers of semiconductor materials from group III, group IV, or group V semiconductor, and a second semiconductor region coupled with the first semiconductor region and having an optical waveguide, a first trench disposed on a first side of the optical waveguide, and a second trench disposed on a second side, opposite the first side, of the optical waveguide. Other embodiments may be described and/or claimed.

12 Claims, 9 Drawing Sheets

(51) Int. Cl.
*B82Y 20/00* (2011.01)
*H01S 5/026* (2006.01)
*H01S 5/042* (2006.01)
*G02B 6/122* (2006.01)

(56) References Cited

U.S. PATENT DOCUMENTS

2010/0309943 A1   12/2010   Chakraborty et al.
2012/0189317 A1*  7/2012    Heck et al. .................... 398/141
2012/0300796 A1*  11/2012   Sysak et al. ....................... 372/6

OTHER PUBLICATIONS

J. Bowers et al., "Hybrid Silicon Lasers: The Final Frontier to Integrated Computing," Optics & Photonics News, May 2010, pp. 28-33.
G. Roelkens et al., "III-V/silicon photonics for on-chip and intra-chip optical interconnects," Laser & Photon Reviews, Jan. 2010, pp. 1-29.
International Search Report and Written Opinion for PCT/US2012/030601, mailed Nov. 26, 2012, 8 pages.
International Preliminary Report on Patentability for PCT Application No. PCT/US2012/030601, dated Oct. 9, 2014, 8 pages.

* cited by examiner

HYBRID LASER INCLUDING ANTI-RESONANT WAVEGUIDES

GOVERNMENT INTEREST

This invention was made with Government support under contract number H98230-10-9-0021 awarded by the Department of Defense. The Government has certain rights in this invention.

CROSS REFERENCE TO RELATED APPLICATION

The present application is a national phase entry under 35 U.S.C. §371 of International Application No. PCT/US2012/030601, filed Mar. 26, 2012, entitled "HYBRID LASER INCLUDING ANTI-RESONANT WAVEGUIDES," which designates, among the various States, the United States of America, and the entire contents and disclosures of which are hereby incorporated by reference in their entireties.

TECHNICAL FIELD

Embodiments of the invention relate generally to the field of lasers. More particularly, embodiments of the invention relate to an apparatus including a hybrid laser including anti-resonant waveguides, and a system including the hybrid laser having anti-resonant waveguides.

BACKGROUND

Semiconductor lasers may be made from light-emitting properties of III-V semiconductor materials. Semiconductor lasers may be composed of two components, an III-V active region to generate light and a silicon waveguide to carry the generated light.

The optical mode of some hybrid lasers may be controlled by the waveguide dimensions. In general, a high overlap of the optical mode with the III-V region of the hybrid laser is desired. Pushing the optical mode into the III-V region, however, may sometimes result in optical mode leakage and/or widening of the optical mode.

BRIEF DESCRIPTION OF THE DRAWINGS

Embodiments of the present disclosure will be described by way of example embodiments, but not limitations, illustrated in the accompanying drawings in which like references denote similar elements, and in which.

all in accordance with embodiments of the present disclosure.

DETAILED DESCRIPTION

Described herein are embodiments of an apparatus including a hybrid laser including anti-resonant waveguides, a system including the hybrid laser having anti-resonant waveguides, and a method for forming a hybrid laser including anti-resonant waveguides.

In the following description, numerous details are discussed to provide an explanation of various embodiments. It will be apparent to those skilled in the art, however, that embodiments of the present invention may be practiced without these specific details. In other instances, well-known structures and devices may be shown in block diagram form, rather than in detail, in order to avoid obscuring embodiments of the present invention. For example, the height and/or depth of each layer forming the active region is not described herein. Furthermore, the embodiments of the invention are not limited to a particular composition and material system of the active region as long as the composition of the active region allows for a hybrid laser including anti-resonant waveguides as discussed in the embodiments.

Figure 1:
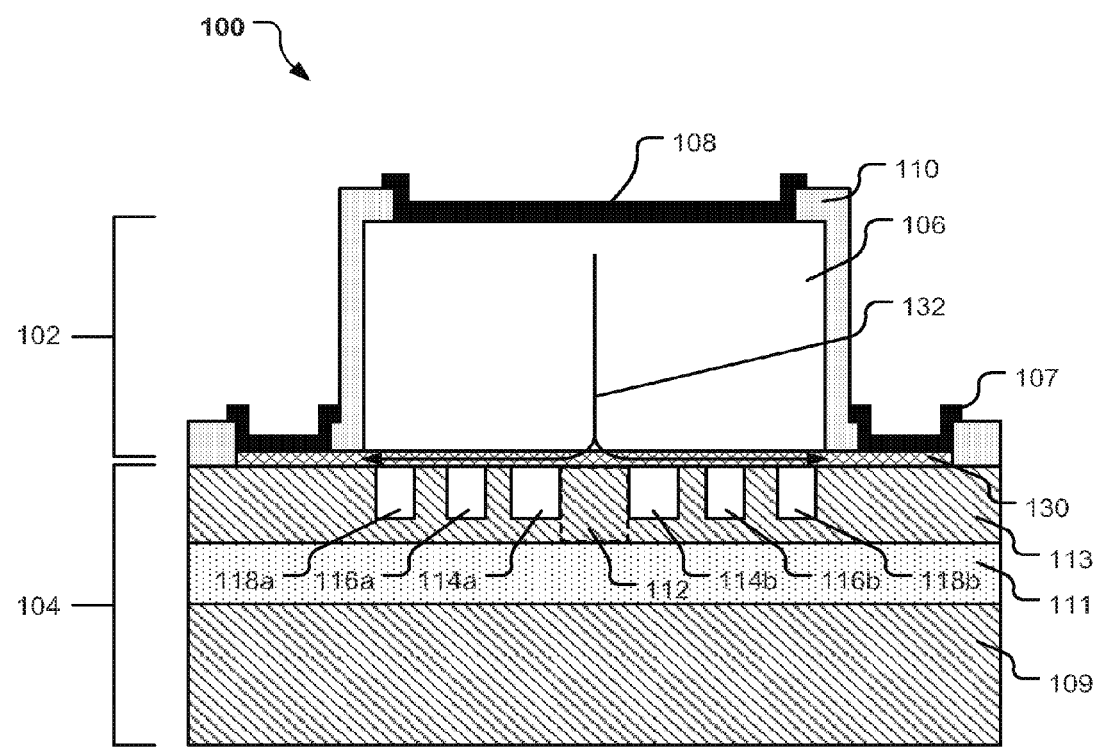
FIG. 1 illustrates a cross-section of a hybrid laser including anti-resonant waveguides.

FIG. 1 illustrates a cross-section of a hybrid laser apparatus 100 including a first semiconductor region 102 and a second semiconductor region 104 coupled with the first semiconductor region 102. The first semiconductor region 102 may include an active region 106 and one or more electrical contacts 107, 108 coupled with the active region 106 to provide an electrical current to the active region 106. The first semiconductor region 102 may include an insulating material 110 covering portions of the active region 106 and/or the first semiconductor region 102.

The second semiconductor region 104 may include an optical waveguide 112 indicated generally by the region demarcated by the hashed-line box. The optical waveguide 112 may be defined by a pair of waveguide trenches 114a, 114b. In various embodiments, anti-resonance waveguides may include anti-resonance waveguide trenches 116a, 118a may be disposed on a first side of the optical waveguide 112, and anti-resonance waveguide trenches 116b, 118b may be disposed on a second side, opposite the first side, of the optical waveguide 112, as shown. The waveguide trenches 114a, 114b and the anti-resonant waveguide trenches 116a, 116b, 118a, 118b may be filled with a gas. In various embodiments, the gas may be air, an inert gas, or other gas. In some embodiments, the gas may be any gas that may be trapped in the trenches 114a, 114b, 116a, 116b, 118a, or 118b during processing. In other embodiments, the waveguide trenches 114a, 114b and/or the anti-resonant waveguide trenches 116a, 116b, 118a, 118b may be filled with another low-refractive index material such as, for example, silicon oxide or silicon nitride.

The trenches 116a, 116b, 118a, 118b may provide anti-resonant reflection to control the optical mode width while still allowing the optical waveguide 112 to control the overlap of the optical mode with the active region 106. In various embodiments, the trenches 116a, 116b, 118a, 118b may provide additional reflections of the optical mode during operation of the hybrid laser apparatus 100, which may help control the lateral extension of the optical mode.

The second semiconductor region 104 may comprise any suitable material or materials for forming a hybrid laser apparatus. In various embodiments, the second semiconductor region 104 may comprise a semiconductor substrate. For example, the second semiconductor region 104 may comprise a silicon-on-insulator substrate comprising a handle substrate 109, a buried insulating layer 111 on the handle substrate 109, and a silicon layer 113 on the buried insulating layer 111. The buried insulating 111 may comprise oxide. In various embodiments, the buried insulating 111 may comprise sapphire or another suitable insulating material. The handle substrate 109 may comprise silicon, such as, for example, doped silicon. The silicon layer 113 may comprise a device fabrication wafer or epitaxial silicon. In various embodiments, the silicon layer 113 may comprise <100> silicon.

In other implementations, the second semiconductor region 104 may be formed using alternate materials, which may or may not be combined with silicon, that include but are not limited to germanium, indium antimonide, lead telluride, indium arsenide, indium phosphide, gallium arsenide, or gallium antimonide. Further materials classified as group III-V or group IV materials may also be used to form the substrate. Although a few examples of materials from which the substrate may be formed are described here, any material that may serve as a foundation upon which a semiconductor device may be built falls within the spirit and scope of the present invention.

Figure 2:
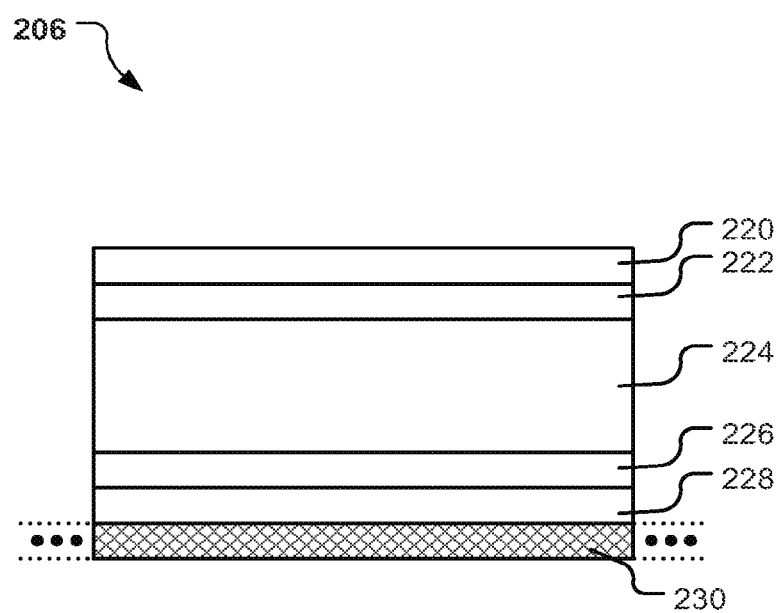
FIG. 2 illustrates a cross-section of an active region of a hybrid laser including anti-resonant waveguides.

The active region 106 of the first semiconductor region 102 may be a III-V active region including layers of semiconductor materials from group III, group IV, or group V semiconductor. FIG. 2 illustrates a cross-section of an example III-V active region 206, according to various embodiments of the invention. In various embodiments, the contact 108 (shown in FIG. 1) may be coupled to layer 220. In one embodiment, the layer 220 is an ohmic contact layer. In one embodiment, the ohmic contact layer 220 is composed of p-type indium gallium arsenide (InGaAs). The layer 220 may be coupled to a cladding layer 222. In one embodiment, the cladding layer 222 is composed of p-type indium phosphide (InP). The cladding layer 222 may be coupled to a separated confinement hetero-structure (SCH) layer 224. In one embodiment, the layer 224 is composed of p-type aluminum gallium indium arsenide (AlGaInAs). The layer 224 may be coupled to a carrier blocking layer 226. In one embodiment the layer 226 is also composed of AlGaInAs. The layer 226 may be coupled to a multiple quantum well (MQW) layer 228. In one embodiment, the MQW layer 228 is composed from AlGaInAs. The MQW layer 228 may be coupled to the layer 230 (shown as layer 130 in FIG. 1), which may be composed of n-type indium phosphide (InP). The layers discussed above may have slight differences in their atomic ratios to tune the exact bandgap, according to one embodiment of the invention.

The silicon layer 113 of the second semiconductor region 104 may provide a path of electric current to the contacts 107. Referring again to FIG. 1, the layer 130 (layer 230 of FIG. 2, in some embodiments) may extend laterally on either side of the active region 106 (see dotted extension of layer 230 of FIG. 2) to connect with the electrical contacts 107, and the optical waveguide 112 may be formed directly under the layer 130. In one embodiment, trenches 114a, 114b formed on the sides of the optical waveguide 112 confine light within the waveguide 112. The optical waveguide 112 may carry the optical signal in the form of a laser, which may be generated by applying a voltage potential across the contacts 107 and 108. In one embodiment, the potential difference across the contacts 107 and 108 may be such that a current 132 of 30-150 mA flows from the contact 108 to the contact 107 via the layer 130 to cause the generation of an optical laser in the optical waveguide 112. In one embodiment, the contact 108 may be operable to receive a positive voltage potential while the contact 107 may be operable to receive a negative voltage potential.

Figure 3:
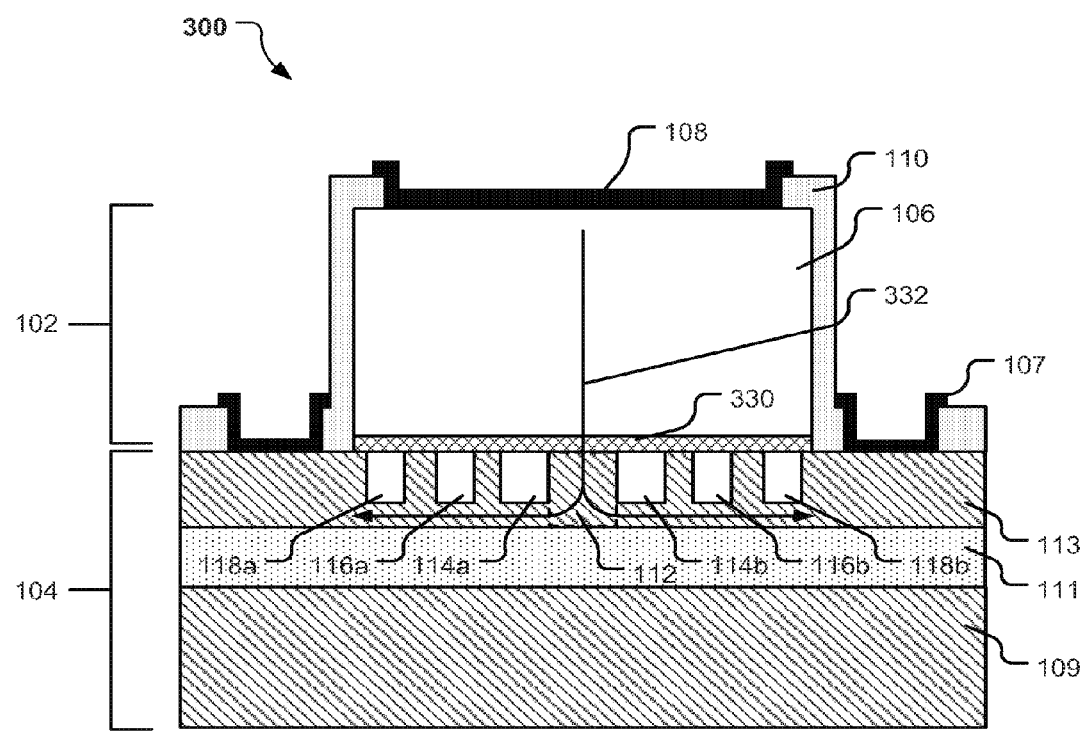
FIG. 3 illustrates a cross-section of another hybrid laser including anti-resonant waveguides.

In other embodiments, the layer 230 does not extend laterally on either side of the active region 206, as shown by layer 330 of FIG. 3. In such an embodiment, the electric current 332 flows into the silicon layer 113 of the second semiconductor region 204 and out to the contacts 107. In one embodiment, such conductive interface enables the silicon layer 113 to act as an electrical contact by itself.

In various embodiments, the spacing and/or width of the anti-resonant waveguide trenches 116a, 116b, 118a, 118b and the waveguide trenches 114a, 114b may contribute to the optical leakage loss of the hybrid laser apparatus 100 and/or the location of the optical mode. The optical waveguide 112 may have a width configured for providing a suitable optical mode overlap with the active region 106. In various embodiments, the width of the optical waveguide 112 may be about 0.4 µm. In various embodiments, the trenches 114a, 116a, and 118b may separated from each other by about 1.0 µm (i.e., about 1.0 µm of the silicon layer 113 separates the waveguide trench 114a from the anti-resonant waveguide trench 116a, and about 1.0 µm of the silicon layer 113 separates the anti-resonant waveguide trench 116a from the anti-resonant waveguide trench 118a). The other side of the optical waveguide 112 may be similarly configured.

In various embodiments, the waveguide trenches 114a, 114b may each have a width of about 0.5 µm. In other embodiments, the waveguide trenches 114a, 114b may each have a width of about 3.0 µm. In other embodiments, the waveguide trenches 114a, 114b may each have a width in a range of about 0.5 µm to about 3.0 µm.

Figure 4:
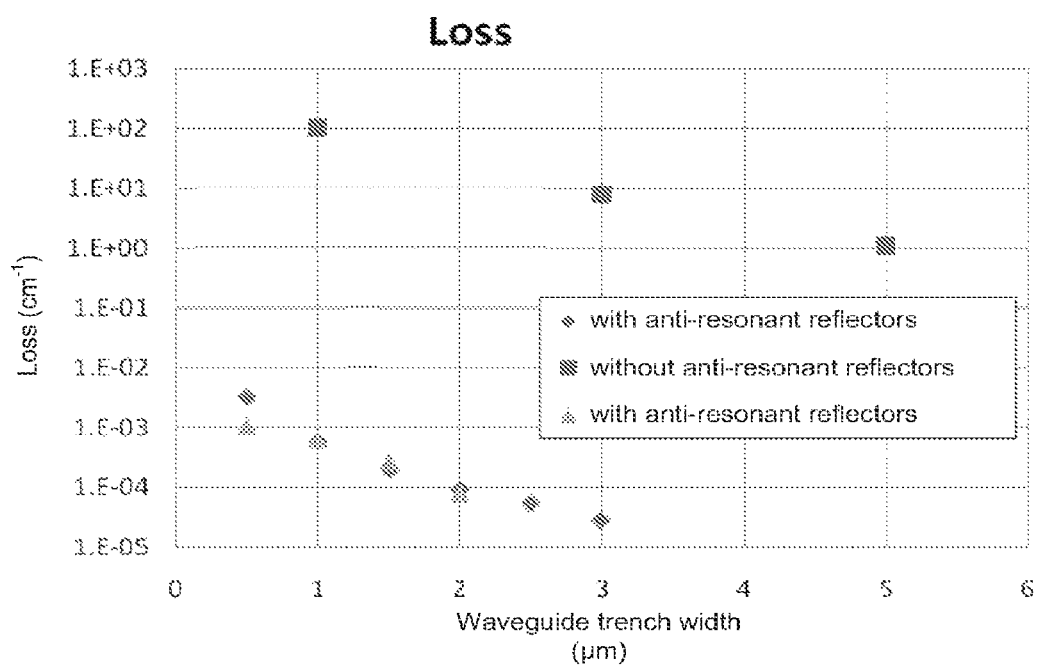
FIG. 4 is a graph showing calculated leakage loss of a hybrid laser including anti-resonant trenches and a hybrid laser not including anti-resonant waveguides.

FIG. 4 is a graph showing calculated leakage loss of a hybrid laser including anti-resonant waveguide trenches and a hybrid laser not including anti-resonant waveguide trenches. In all three examples, the optical waveguide width is about 0.4 µm. As shown, both examples of the hybrid laser including anti-resonant waveguide trenches (shown by the triangle and diamond data points) have a greater than 100 times reduction in leakage loss as compared to the hybrid laser not including anti-resonant waveguide trenches (shown by the square data points). In other words, various embodiments of the hybrid lasers described herein may allow for less optical leakage when increasing the optical mode overlap with the active region.

Figure 5:
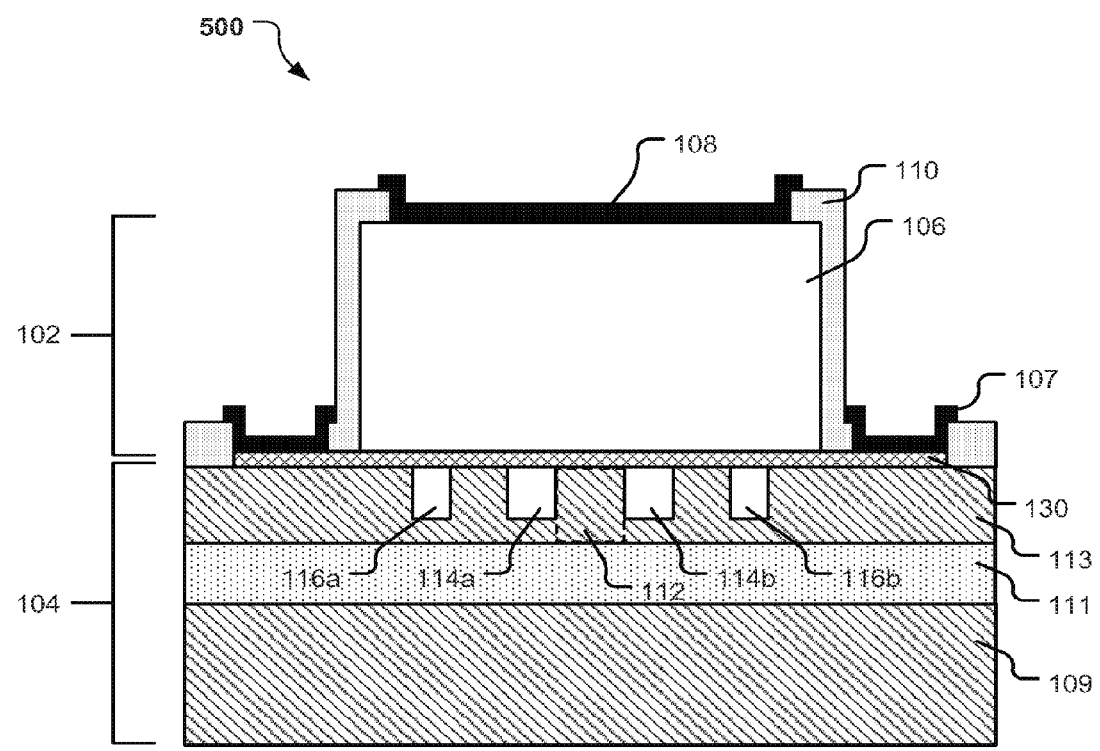
FIG. 5 illustrates a cross-section of another hybrid laser including anti-resonant waveguides.

In the embodiments shown in FIG. 1 and FIG. 3, two anti-resonant waveguide trenches (116a, 118a and 116b, 118b) are provided on each side of the optical waveguide 112 and its associated waveguide trenches 114a, 114b. In other embodiments, more or fewer anti-resonant waveguide trenches may be provided. As shown in FIG. 5, for example, the hybrid laser apparatus 500 includes one anti-resonant waveguide trench 116a, 116b on each side of the optical waveguide 112 and its associated waveguide trenches 114a, 114b. In other embodiments, more than two anti-resonant waveguide trenches (not illustrated) may be provided on each on each side of the optical waveguide 112 and its associated waveguide trenches 114a, 114b.

Figure 6:
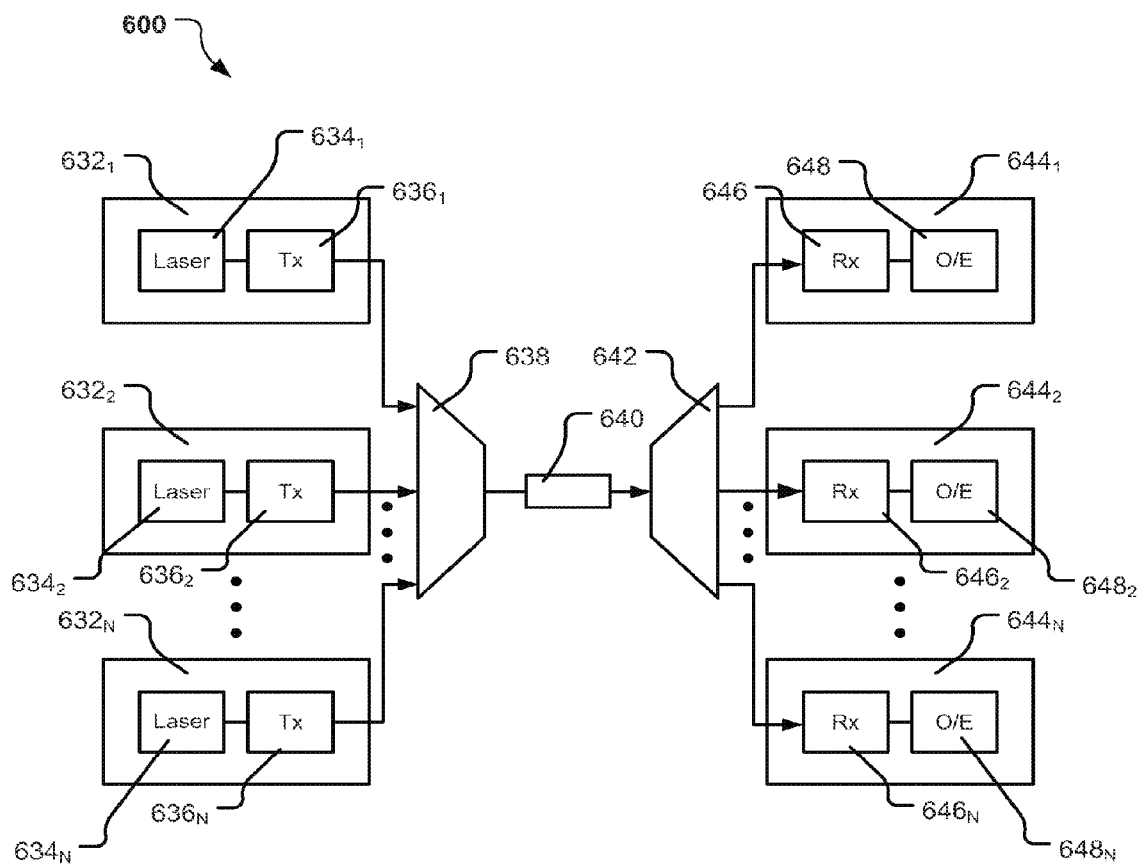
FIG. 6 illustrates an optical system having one or more of the hybrid lasers of FIG. 1, FIG. 3, or FIG. 5.

FIG. 6 illustrates an optical system 600 having one or more of the hybrid lasers $634_{1-N}$, one or more of which may be a laser such as laser 100, 300, or 500, described herein. The hybrid lasers $634_{1-N}$ may be located in an optical transmitter, according to one embodiment of the invention. In one embodiment, the system 600 comprises one or more optical transmitters $632_{1-N}$. Each optical transmitter from the optical transmitters $632_{1-N}$ may comprise a hybrid laser unit $634_{1-N}$ coupled to a transmitter $636_{1-N}$. In one embodiment, the transmitter 636$_{1-N}$ transmits an optical signal of different wavelengths via multiplexer 638, optical waveguide 640, and de-multiplexer 642. In one embodiment, the wavelengths range from wavelengths of less than 900 nm or wavelengths from a range of 1260 nm to 1380 nm. In one embodiment, the transmitter 636$_{1-N}$ comprises a modulator (not shown) that receives the laser beam generated by the hybrid laser unit 634$_{1-N}$ and modulates the laser beam, wherein the modulated beam is then transmitted over the optical waveguide 640 to an optical receiver 644$_{1-N}$.

In one embodiment, each optical receiver from among the optical receivers 644$_{1-N}$ comprises a receiver 646$_{1-N}$ coupled to an optical to electrical conversion unit 648$_{1-N}$. In one embodiment, the receiver 646$_{1-N}$ comprises an array of photo-detectors. In one embodiment, the de-multiplexer 642 couples an optical transmitter from among the optical transmitters 632$_{1-N}$ to a corresponding optical receiver from among the optical receivers 644$_{1-N}$. In one embodiment, the optical waveguide 640 is an optical Universal Serial Bus (USB) cable. In one embodiment the optical waveguide 640 is an optic fiber cable. In one embodiment, the optical transmitters 632$_{1-N}$ and receivers 644$_{1-N}$ reside in their respective computer systems (not shown). In various embodiments, the lasers 634$_{1-N}$ and/or photo-detectors of the receiver 646$_{1-N}$ can be coupled to respective processors, or to the same processor, to provide input/output. In some of these embodiments, the lasers 634$_{1-N}$ and/or photo-detectors of the receiver 646$_{1-N}$ can be coupled to their respective processors, or to the same processor, to provide input/output through an I/O management chip.

Figure 7:
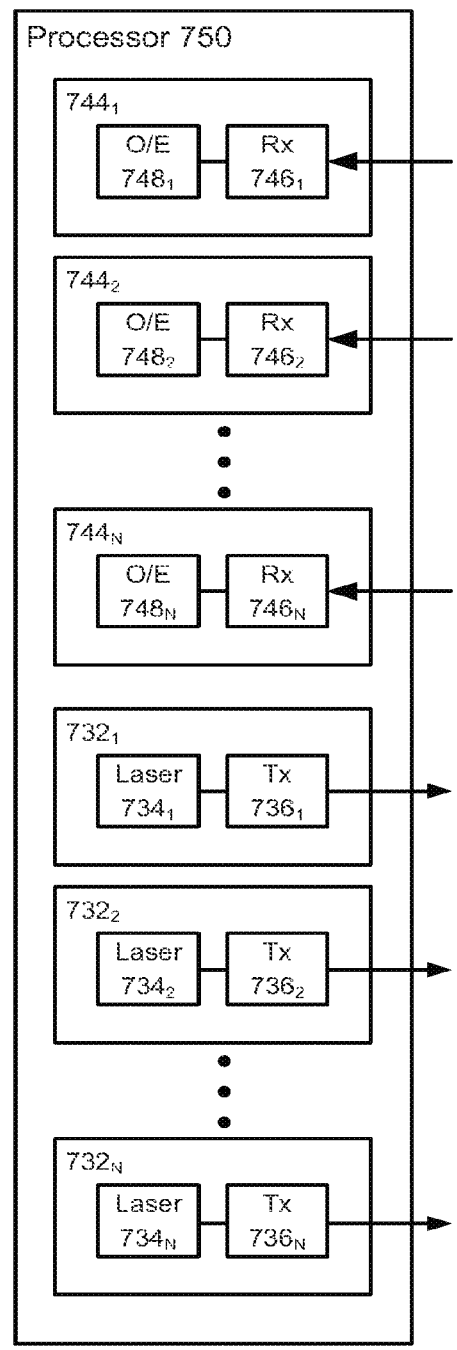
FIG. 7 illustrates another optical system having one or more of the hybrid lasers of FIG. 1, FIG. 3, or FIG. 5.

FIG. 7 shows an embodiment in which optical transmitters 732$_{1-N}$, including lasers 734$_{1-N}$ and transmitters 736$_{1-N}$, and receivers 744$_{1-N}$, including receiver 646$_{1-N}$ and optical to electrical conversion units 648$_{1-N}$, reside on the same processor 750. In various ones of these embodiments, the receivers 746$_{1-N}$ comprises an array of photo-detectors may be configured to receive input(s) from a source other than the processor 750. Likewise, in various embodiments, the transmitters 736$_{1-N}$ configured to output optical signal(s) to a destination other than the processor 750.

Figure 8:
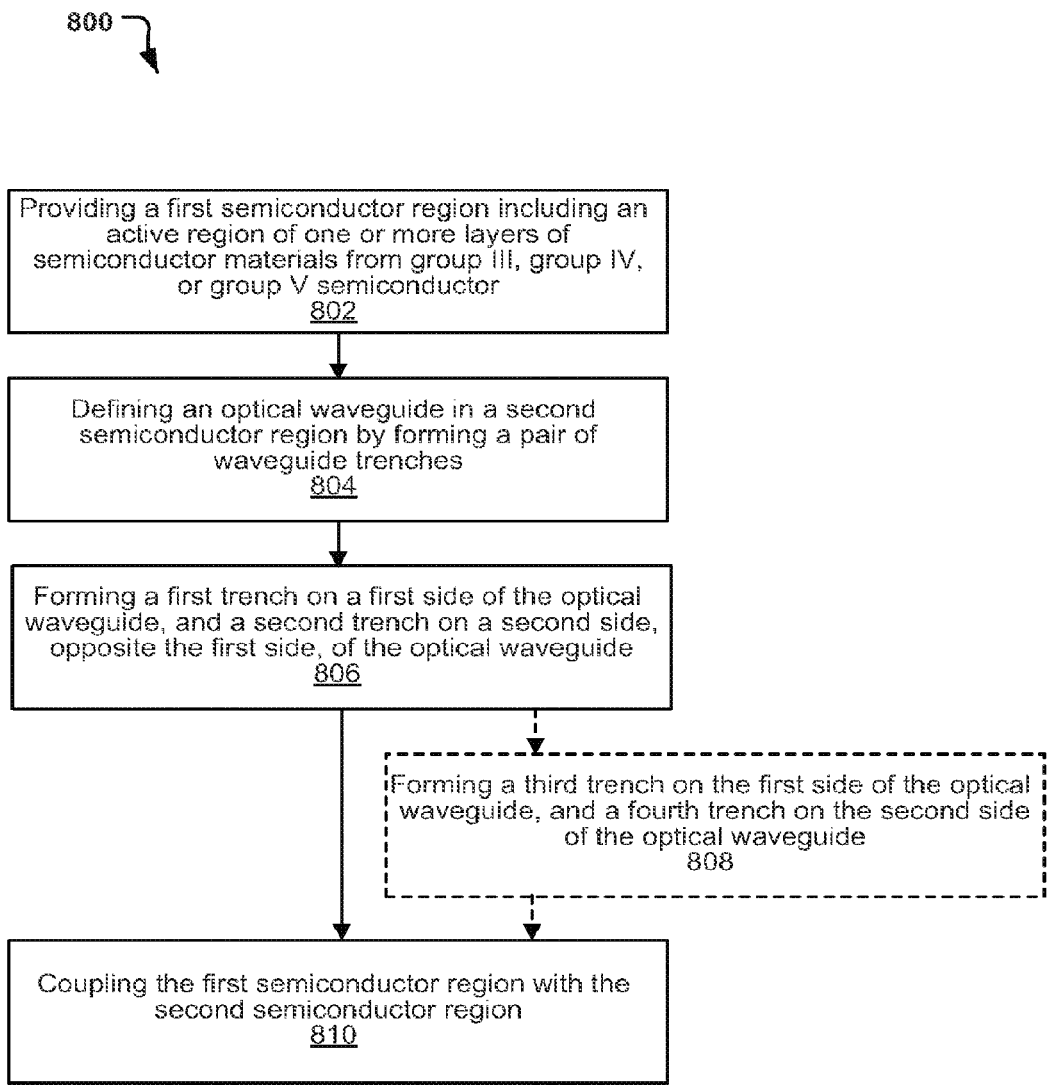
FIG. 8 is a flow chart of a method to form a hybrid laser including anti-resonant waveguides.

FIG. 8 is a flow diagram of some of the operations associated with method 800 for making an apparatus including a photonic device (100 or 400 described herein, for example) having a conductive shunt substrate, in accordance with various embodiments.

Turning now to FIG. 8, a method for making an apparatus including the hybrid laser including anti-resonant waveguide trenches (such as, for example, hybrid laser apparatus 100, 300, or 500) may include one or more functions, operations, or actions as is illustrated by block 802, 804, 806, 808, and/or 810.

Processing for the method 800 may start with block 802 by providing a first semiconductor region including an active region of one or more layers of semiconductor materials from group III, group IV, or group V semiconductor.

The method 800 may proceed to block 804 by defining an optical waveguide in a second semiconductor region by forming a pair of waveguide trenches.

The method 800 may then proceed to block 806 by forming a first trench on a first side of an optical waveguide, and a second trench on a second side, opposite the first side, of the optical waveguide. In various embodiments, the operations of blocks 804 and 806 may be performed during a single operation.

At block 810, the method 800 may proceed by coupling the first semiconductor region with the second semiconductor region to form the hybrid laser apparatus.

In various embodiments, the method 800 may optionally proceed from block 806 to block 808 by forming a third trench on the first side of the optical waveguide such that the first trench is between the third trench and the optical waveguide, and forming a fourth trench on the second side of the optical waveguide such that the second trench is between the fourth trench and the optical waveguide. In various embodiments, the operations of blocks 804, 806, and 808 may be performed during a single operation. In other embodiments, the operations of blocks 806 and 808 may be performed during a single operation, and the operations of block 804 may be performed prior to or after the single operation. After optional block 808, the method 800 may proceed to block 810.

In one embodiment, the method of FIG. 8 can be performed by executing machine-readable instructions by a processor, wherein the machine-readable instructions are stored on a machine-readable storage medium (e.g., a flash memory, a dynamic random access memory, a static random access memory, etc.) coupled to the processor.

Figure 9:
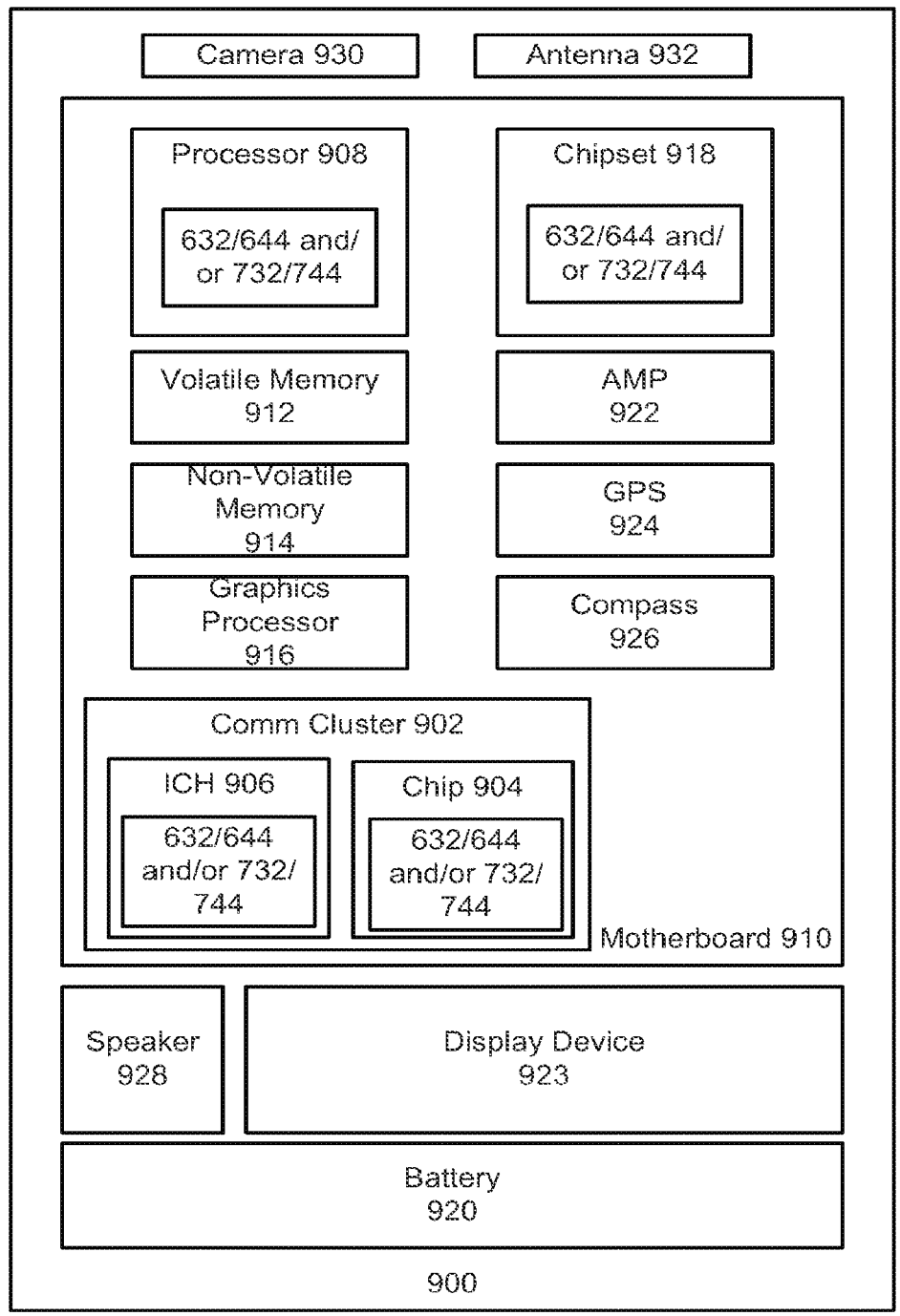
FIG. 9 is a block diagram of a system incorporating one or more of the hybrid lasers of FIG. 1, FIG. 3, or FIG. 5 and/or optical system of FIG. 6 and/or optical system of FIG. 7.

Embodiments of hybrid laser apparatuses and/or optical systems described herein may be incorporated into various other apparatuses and systems including, but not limited to, various computing and/or consumer electronic devices/appliances. A system level block diagram of an example system 900 is illustrated in FIG. 9. The hybrid laser apparatuses and/or optical systems described herein may be included in one or more of the elements of the system 900. For example, in various implementations, the processor 908, the chipset 918, the communication chip 904, and/or the I/O controller hub 906 may include a transmitter 632 and receiver 644 (of FIG. 6) and/or transmitter 732 and receiver 744 (of FIG. 7) having the hybrid laser apparatus 100 (of FIG. 1), 300 (of FIG. 3), and/or 500 (of FIG. 5) for communicating with one or more other elements of the system 900 or connected to the system 900. In various embodiments, the system 900 may include more or fewer components, and/or different architectures than that shown in FIG. 9.

In various implementations, the system 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the system 900 may be any other electronic device that processes data.

The system 900 may include a communications cluster 902 operatively to facilitate communication of the system 900 over one or more networks and/or with any other suitable device. The communications cluster 902 may include at least one communication chip 904 and at least one I/O controller hub 906. In some implementations, the at least one I/O controller hub 906 may be part of the at least one communication chip 904. In some implementations the at least one communication chip 904 may be part of the processor 908.

In various embodiments, the system 900 may house a motherboard 910 with which the processor 908 and/or the communications cluster 902 may be physically and electrically coupled.

Depending on its applications, the system 900 may include other components that may or may not be physically and electrically coupled to the mother board. These other components include, but are not limited to, volatile memory 912 (e.g., DRAM), non-volatile memory 914 (e.g., ROM), flash memory, a graphics processor 916, a digital signal processor, a crypto processor, a chipset 918, a battery 920, an audio codec, a video codec, a power amplifier 922, a global positioning system (GPS) device 924, a compass 926, an accelerometer, a gyroscope, a speaker 928, a camera 930, an antenna 932, and a mass storage device (such as hard disk drive, compact disk (CD), digital versatile disk (DVD), and so forth).

The communication chip 904 may enable wireless communications for the transfer of data to and from the system 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 904 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 2G, 3G, 4G, 5G, and beyond. The system 900 may include a plurality of communication chips 904. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The system 900 may include a display device 934, such as, for example, a cathode ray tube (CRT), liquid crystal display (LCD), light emitting diode (LED), or other suitable display device. The display device 934 may be a touch screen display supporting touch screen features, and in various one of these embodiments, the I/O controller 906 may include a touchscreen controller. In various embodiments, the display device 934 may be a peripheral device interconnected with the system 900.

The processor 908 of the system 900 may include an integrated circuit die packaged within the processor 908. In some implementations, the integrated circuit die of the processor 908 may include one or more devices, such as transistors or metal interconnects. The term "processor" may refer to any device or portion of a device that processes electronic data from registers and/or memory to transform that electronic data into other electronic data that may be stored in registers and/or memory. The communication chip 904 may also include an integrated circuit die packaged within the communication chip 904. The I/O controller hub 906 may also include an integrated circuit die packaged within the I/O controller hub 906.

The following paragraphs describe various embodiments.

In various embodiments, a hybrid laser apparatus may comprise a first semiconductor region including an active region of one or more layers of semiconductor materials from group III, group IV, or group V semiconductor. In various embodiments, the apparatus may further comprise a second semiconductor region coupled with the first semiconductor region and having an optical waveguide, a first trench disposed on a first side of the optical waveguide, and a second trench disposed on a second side, opposite the first side, of the optical waveguide.

In various embodiments, the optical waveguide is defined by a pair of waveguide trenches.

In various embodiments, the second semiconductor region includes a third trench disposed on the first side of the optical waveguide such that the first trench is between the third trench and the optical waveguide, and a fourth trench disposed on the second side of the optical waveguide such that the second trench is between the fourth trench and the optical waveguide.

In various embodiments, a layer of the first semiconductor region is directly bonded with a layer of the second semiconductor region, wherein the layer of the first semiconductor region is composed of indium phosphide, and wherein the layer of the second semiconductor region is composed of silicon. In various embodiments, the apparatus further comprises a first electrical contact coupled with the active region of the first semiconductor region, and a second electrical contact coupled with the indium phosphide layer of the first semiconductor region. In various embodiments, the apparatus further comprises a first electrical contact coupled with the active region of the first semiconductor region, and a second electrical contact coupled with the silicon layer of the second semiconductor region.

In various embodiments, the layers of the first semiconductor region comprise at least one of an ohmic contact layer coupled with a first electrical contact layer, a cladding layer coupled with the ohmic contact layer, a separated confinement hetero-structure (SCH) layer coupled with the cladding layer, a carrier blocking layer coupled with the SCH layer, a multiple quantum well (MQW) layer coupled with the SCH layer, and an indium phosphide layer coupled with the MQW layer, wherein a surface of the indium phosphide layer is coupled with a surface of a layer of the second semiconductor region.

In various embodiments, the second semiconductor region comprises a silicon-on-insulator structure.

All optional features of the apparatuses described above may also be implemented with respect to various systems described herein. For example, in various embodiments, a system may include one or more of the hybrid lasers described above. In various embodiments, system includes a receiver to receive an optical signal. In various embodiments, the system includes a transmitter to transmit the optical signal. In various embodiments, the transmitter may comprise the hybrid laser to generate a laser beam.

In various embodiments, the system further comprises a modulator coupled to the hybrid laser to modulate the laser beam transmitted over the silicon waveguide. In various embodiments, the receiver comprises a photo-detector to detect the modulated laser beam.

In various embodiments, the system further comprises a processor operatively coupled with the receiver and the transmitter, and a display device operatively coupled to the processor. In various embodiments, the display device is a touch screen.

In various embodiments, the system is a selected one of a laptop, a notebook, a notebook, an ultrabook, a smartphone, a tablet, a personal digital assistant, an ultra mobile PC, a mobile phone, a desktop computer, a server, a printer, a scanner, a monitor, a set-top box, an entertainment control unit, a digital camera, a portable music player, or a digital video recorder.

All optional features of the apparatuses and systems described above may also be implemented in various methods. For example, in various embodiments, a method for making a hybrid laser comprises providing a first semiconductor region including an active region of one or more layers of semiconductor materials from group III, group IV, or group V semiconductor. In various embodiments, the method further comprises forming a first trench on a first side of an optical waveguide of a second semiconductor region, and a second trench on a second side, opposite the first side, of the optical waveguide. In various embodiments, the method further comprises coupling the first semiconductor region with the second semiconductor region.

In various embodiments, the method further comprises defining the optical waveguide in the second semiconductor region by forming a pair of waveguide trenches, wherein the optical waveguide is disposed between the pair of waveguide trenches.

In various embodiments, the method further comprises forming a third trench on the first side of the optical waveguide such that the first trench is between the third trench and the optical waveguide, and forming a fourth trench on the second side of the optical waveguide such that the second trench is between the fourth trench and the optical waveguide.

Various aspects of the illustrative implementations are described herein using terms commonly employed by those skilled in the art to convey the substance of their work to others skilled in the art. It will be apparent to those skilled in the art, however, that embodiments of the present invention may be practiced with only some of the described aspects. For purposes of explanation, specific numbers, materials and configurations are set forth in order to provide a thorough understanding of the illustrative implementations. It will be apparent to one skilled in the art, however, that embodiments of the present invention may be practiced without the specific details. In other instances, well-known features are omitted or simplified in order not to obscure the illustrative implementations.

Further, various operations are described as multiple discrete operations, in turn, in a manner that is most helpful in understanding the illustrative embodiments; however, the order of description should not be construed as to imply that these operations are necessarily order dependent. In particular, these operations need not be performed in the order of presentation. Moreover, methods within the scope of this disclosure may include more or fewer steps than those described.

The phrase "in some embodiments" and "in various embodiments" are used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B". The phrase "at least one of A, B and C" means (A), (B), (C), (A and B), (A and C), (B and C) or (A, B and C). The phrase "(A) B" means (B) or (A and B), that is, A is optional.

Although various example methods, apparatuses, and systems have been described herein, the scope of coverage of the present disclosure is not limited thereto. On the contrary, the present disclosure covers all methods, apparatus, systems, and articles of manufacture fairly falling within the scope of the appended claims, which are to be construed in accordance with established doctrines of claim interpretation. For example, although the above discloses example systems including, among other components, software or firmware executed on hardware, it should be noted that such systems are merely illustrative and should not be considered as limiting. In particular, it is contemplated that any or all of the disclosed hardware, software, and/or firmware components could be embodied exclusively in hardware, exclusively in software, exclusively in firmware or in some combination of hardware, software, and/or firmware.

What is claimed is:

1. A system including one or more hybrid lasers, the system comprising:
   a receiver to receive an optical signal; and
   a transmitter to transmit the optical signal, the transmitter comprising a hybrid laser to generate a laser beam, the hybrid laser including:
      a first semiconductor region including an active region of one or more layers of semiconductor materials from group III, group IV, or group V semiconductor; and
      a second semiconductor region coupled with the first semiconductor region, wherein the second semiconductor region includes at least a buried insulating layer and a silicon layer disposed on the buried insulating layer, and further includes an optical waveguide, a first trench disposed on a first side of the optical waveguide, a second trench disposed on a second side, opposite the first side, of the optical waveguide, a third trench disposed on the first side of the optical waveguide such that the first trench is between the third trench and the optical waveguide, and a fourth trench disposed on the second side of the optical waveguide such that the second trench is between the fourth trench and the optical waveguide, wherein the first, second, third and fourth trenches are disposed inside the silicon layer to have a portion of the silicon layer between a respective trench and the buried insulating layer.

2. The system of claim 1, further comprising a modulator coupled to the hybrid laser to modulate the laser beam transmitted over the silicon waveguide.

3. The system of claim 2, wherein the receiver comprises a photo-detector to detect the modulated laser beam.

4. The system of claim 1, wherein the optical waveguide is defined by a pair of waveguide trenches.

5. The system of claim 1, wherein a layer of the first semiconductor region is directly bonded with the silicon layer of the second semiconductor region, wherein the layer of the first semiconductor region is composed of indium phosphide.

6. The system of claim 5, further comprising:
   a first electrical contact coupled with the active region of the first semiconductor region; and
   a second electrical contact coupled with the indium phosphide layer of the first semiconductor region.

7. The system of claim 5, further comprising:
   a first electrical contact coupled with the active region of the first semiconductor region; and
   a second electrical contact coupled with the silicon layer of the second semiconductor region.

8. The system of claim 1, wherein the layers of the first semiconductor region comprise:
   an ohmic contact layer coupled with a first electrical contact layer;
   a cladding layer coupled with the ohmic contact layer;
   a separated confinement hetero-structure (SCH) layer coupled with the cladding layer;
   a carrier blocking layer coupled with the SCH layer;
   a multiple quantum well (MQW) layer coupled with the SCH layer; and
   an indium phosphide layer coupled with the MQW layer, wherein a surface of the indium phosphide layer is coupled with a surface of a layer of the second semiconductor region.

9. The system of claim 1, wherein the second semiconductor region comprises a silicon-on-insulator structure.

10. The system of claim 1, further comprising a processor operatively coupled with the receiver and the transmitter, and a display device operatively coupled to the processor.

11. The system of claim 10, wherein the display device is a touch screen.

12. The system of claim 1, wherein the system is a selected one of a laptop, a netbook, a notebook, an ultrabook, a smartphone, a tablet, a personal digital assistant, an ultra mobile PC, a mobile phone, a desktop computer, a server, a printer, a scanner, a monitor, a set-top box, an entertainment control unit, a digital camera, a portable music player, or a digital video recorder.

* * * * *